United States Patent [19]

Brabetz

[11] Patent Number: 5,367,264
[45] Date of Patent: Nov. 22, 1994

[54] MEASURING INSTRUMENT AND METHOD FOR DETERMINING THE ALCOHOL CONTENT OF A MIXTURE

[75] Inventor: Ludwig Brabetz, Tournefeuille, France

[73] Assignee: Siemens AG, Munich, Germany

[21] Appl. No.: 61,177

[22] Filed: May 12, 1993

[30] Foreign Application Priority Data

Nov. 16, 1990 [EP] European Pat. Off. ........ 90121970.9

[51] Int. Cl.⁵ .................... G01R 27/26; G01R 27/22; G01N 27/10; G01N 27/22
[52] U.S. Cl. .................... 324/674; 324/663; 324/686; 73/61.43
[58] Field of Search ............... 324/446, 448, 450, 658, 324/663, 664, 667, 670, 674, 686, 689, 690; 73/61.41, 61.43

[56] References Cited

U.S. PATENT DOCUMENTS

| | | | |
|---|---|---|---|
| 4,259,632 | 3/1981 | Ahtiainen | 324/664 |
| 4,638,305 | 1/1987 | Sutton | 324/664 X |
| 4,806,847 | 2/1989 | Atherton et al. | 324/670 |
| 4,831,325 | 5/1989 | Watson, Jr. | 324/678 |
| 4,945,863 | 8/1990 | Schmitz et al. | 123/1 A |
| 5,005,402 | 4/1991 | Pischinger et al. | 324/663 |
| 5,134,381 | 7/1992 | Schmitz et al. | 324/685 |
| 5,182,523 | 1/1993 | Ertel et al. | 324/663 |
| 5,261,270 | 11/1993 | Gonze et al. | 73/61.43 |

FOREIGN PATENT DOCUMENTS

| | | |
|---|---|---|
| 0285070 | 10/1988 | European Pat. Off. . |
| 0335168 | 10/1989 | European Pat. Off. . |
| 59-37464 | 2/1984 | Japan . |
| 2058364 | 4/1981 | United Kingdom . |
| 1434349 | 10/1988 | U.S.S.R. . |

Primary Examiner—Kenneth A. Wieder
Assistant Examiner—Glenn Brown
Attorney, Agent, or Firm—Herbert L. Lerner; Laurence A. Greenberg

[57] ABSTRACT

A measuring instrument has a measuring configuration and a measuring circuit. The measuring circuit determines the capacitance of a capacitor and the conductance of the measuring configuration, which is formed of a casing and a sensor element around which a mixture flows. The alcohol content of the mixture is determined therefrom. The measuring circuit has an oscillator and a control circuit connected upstream thereof. The measuring configuration, which is represented by the capacitor and the conductance, is a part of the oscillator, which oscillates within a measuring cycle at three different oscillator frequencies which are set by three different control voltages of the control circuit, and evaluated in a microcontroller. Component tolerances which influence the oscillator frequencies can thus be taken into account.

10 Claims, 4 Drawing Sheets

MEASURING INSTRUMENT AND METHOD FOR DETERMINING THE ALCOHOL CONTENT OF A MIXTURE

CROSS-REFERENCE TO RELATED APPLICATION:

This application is a Continuation of International Application Serial No. PCT/EP91/02133, filed Nov. 11, 1991.

The invention relates to a measuring instrument for determining the alcohol content of a mixture by determining the capacitance and the conductance of a measuring configuration through which the mixture flows, including a first electrode being formed by a part of the wall of a casing; a second electrode being formed by a sensor element around which the mixture flows; and a measuring circuit with an oscillator having a frequency from which the capacitance of the measuring configuration is determined.

Published European Application No. 0 335 168 A2, corresponding at least partly to U.S. Pat. No. 4,945,863, gives a description of a method for operating an internal combustion engine which is operated with an alcohol/gasoline mixture. The measurement of the alcohol content of a supplied mixture is used for precontrol of the supplied mixture quantity. The alcohol content of the mixture is determined by measuring the capacitance and the loss resistance (expressed below by the conductance) of a measuring configuration through which the mixture flows, in a common measuring circuit. The measuring circuit is capable of oscillating, and its frequency is evaluated as a measure of the capacitance. It is preferable for the measuring configuration to be used as a frequency-determining element of an oscillator having a frequency which can be varied by the parallel connection of a further capacitor or by a switchable delay.

The oscillator operates at high frequencies and delivers a signal which is largely determined by the capacitance of the measuring configuration. The signal depends on the conductance, which represents the losses of the capacitor. Despite the use of very fast components, the propagation time of the signal from an input of the oscillator to its output can no longer be neglected. The propagation time can vary depending on component tolerances.

Since the propagation time also depends on the temperature and the supply voltage and moreover has a long-term drift, a high outlay is required to determine the capacitance of the measuring configuration.

It is accordingly an object of the invention to provide a measuring instrument and a method for determining the alcohol content of a mixture, which overcome the hereinafore-mentioned disadvantages of the heretofore-known devices and methods of this general type and which determine the capacitance of the measuring configuration while taking account of the component tolerances.

With the foregoing and other objects in view there is provided, in accordance with the invention, a measuring instrument for determining the alcohol content of a mixture, comprising a measuring configuration through which a mixture flows, the measuring configuration having a capacitance and a conductance from which the alcohol content of the mixture is to be determined, the measuring configuration including a casing with a wall, part of the wall forming a first electrode, and a sensor element around which the mixture flows, the sensor element forming a second electrode; and a measuring circuit having an oscillator with a frequency from which the capacitance of the measuring configuration is determined and an input receiving a given number of control voltages, and means for measuring an oscillator frequency set for each of the voltages.

In accordance with another feature of the invention, there are provided means for determining a corresponding number of parameters of the measuring configuration from the measured oscillator frequencies.

In accordance with a further feature of the invention, there is provided a control circuit with which the control voltages are generated.

In accordance with an added feature of the invention, the control circuit generates three different control voltages within a measuring cycle.

In accordance with an additional feature of the invention, the oscillator has an output, and there is provided a microcontroller connected to the output of the oscillator for determining the capacitance and the conductance of the measuring configuration from the measured oscillator frequencies.

In accordance with yet another feature of the invention, the oscillator has a comparator and an RC network connected to the comparator.

In accordance with yet a further feature of the invention, the RC network includes the measuring configuration.

In accordance with yet an added feature of the invention, the control circuit has at least one gate with tristate outputs, and a resistance network connected to the at least one gate.

In accordance with yet an additional feature of the invention, the measuring circuit is an integrated, customer-specific circuit.

With the objects of the invention in view, there is also provided a method for determining the alcohol content of a mixture with the measuring instrument, which comprises generating the control voltages in a control circuit for supplying the control voltages to the oscillator, and generating a plurality of the oscillator frequencies by varying the control voltage for determining a plurality of parameters of the measuring circuit from the oscillator frequencies.

In accordance with a concomitant mode of the invention, there is provided a method which comprises determining the capacitance and the conductance of the measuring configuration from the measured oscillator frequencies, and determining a relative dielectric constant of the mixture from the capacitance and from the conductance.

The advantages of the invention reside, inter alia, in the fact that the measuring instrument is constructed from cost-effective and simple components. As mentioned above, the measuring instrument has a measuring configuration and a measuring circuit. The measuring circuit includes an oscillator and a control circuit. The oscillator has a comparator which is connected only to an RC network. The measuring configuration is a part of the RC network. The capacitance and the conductance of the measuring configuration can be determined by using only one sensor element.

The oscillator oscillates at a frequency which is varied within a measuring cycle by the control circuit. The frequency is evaluated in order to determine the capacitance and the conductance. In the control circuit, use is made of a commercially available gate which has tristate outputs, or of an integrated circuit with semiconductor switches. The gate and the circuit are connected only to a resistance network. The measuring circuit can also be realized as an application-specific integrated circuit (ASIC).

Other features which are considered as characteristic for the invention are set forth in the appended claims.

Although the invention is illustrated and described herein as embodied in a measuring instrument and a method for determining the alcohol content of a mixture, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
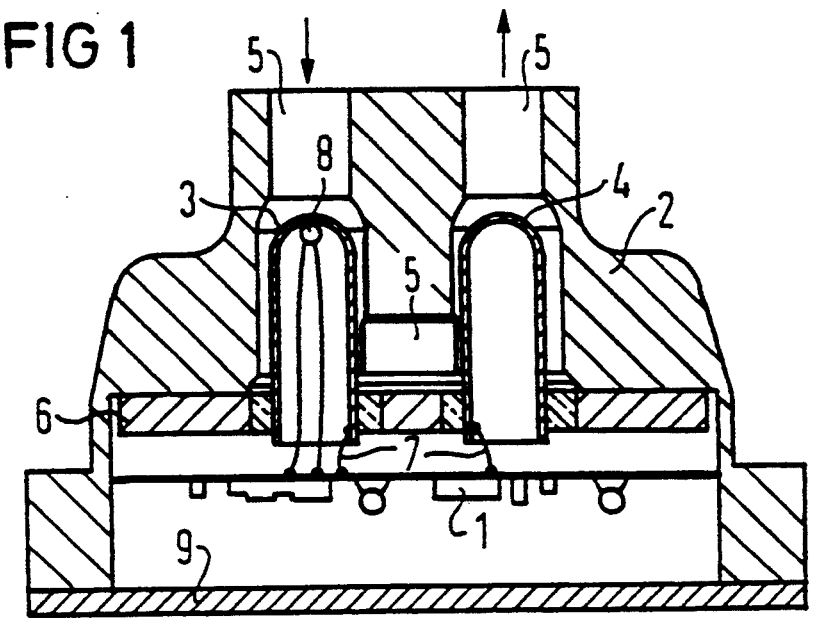
FIG. 1 is a diagrammatic, longitudinal-sectional view of a measuring instrument for determining the alcohol content of a mixture.

Referring now to the figures of the drawing in detail and first, particularly, to FIG. 1 thereof, there is seen a measuring instrument for determining the alcohol content of a mixture, which has a measuring configuration and a measuring circuit 1. The measuring configuration includes a casing 2 and has first and second sensor elements 3 and 4, for example. The mixture in which alcohol and gasoline are contained flows in a fuel channel 5 through the casing 2 in a direction specified by arrows. The sensor elements 3 and 4 are glass-encapsulated in an intermediate plate 6 and connected electrically to the measuring circuit 1 through a wire 7. A temperature sensor 8 for measuring the mixture temperature is located in the first sensor element 3. The casing 2 is sealed by a baseplate 9.

A part of a wall of the casing 2 forms a first electrode and the sensor element 3 forms a second electrode of a capacitor $C_p$ which has a capacitance that is measured. The mixture flows around the sensor elements 3 and 4, and in so doing forms a dielectric of the capacitor $C_p$. A relative dielectric constant $\epsilon_r$ of the mixture is computed from the capacitance of the capacitor $C_p$.

Figure 5:
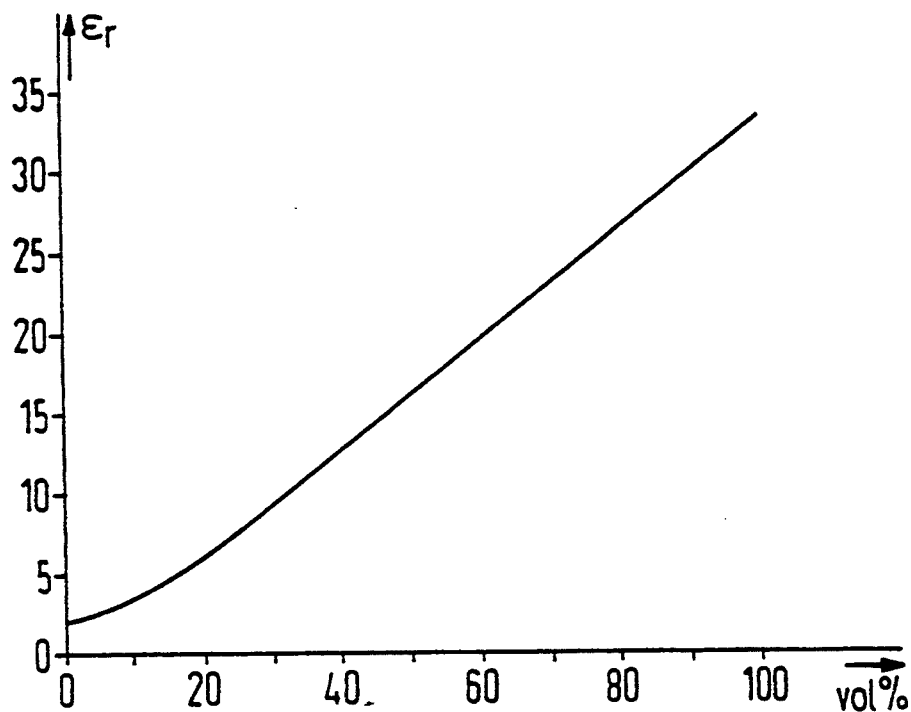
FIG. 5 is a graph showing the relative dielectric constant $\epsilon_r$ as a function of the alcohol content of a mixture for a mixture temperature of T=20° C.
Figure 6:
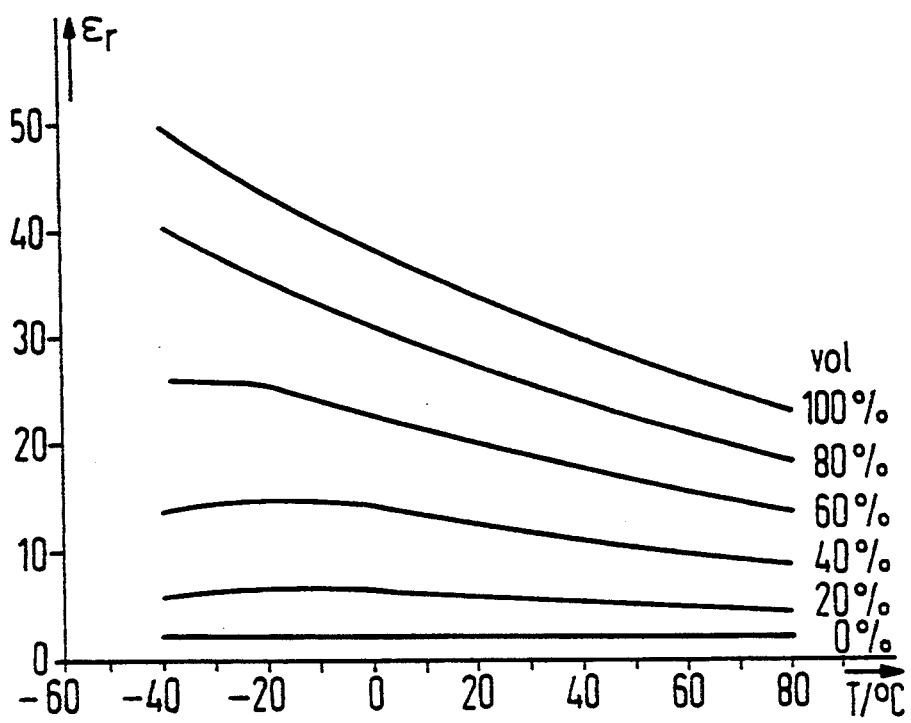
FIG. 6 shows the relative dielectric constant $\epsilon_r$ as a function of the temperature T for mixtures with a different alcohol content.

The mixture is composed of volumetric fractions of alcohol and gasoline. The alcohol and gasoline have different dielectric constants. The relationship between the relative dielectric constant $\epsilon_r$ of the mixture and the volumetric fraction of alcohol in % by volume is shown in FIG. 5 for a mixture temperature of T=20° C. The dependence of the relative dielectric constant $\epsilon_r$ on the mixture temperature T in degrees Celsius (°C.) is represented in FIG. 6 in percentage by volume (% by volume) for different volumetric fractions of alcohol. It is thus possible to determine the alcohol content from knowledge of the resulting relative dielectric constant $\epsilon_r$ of the mixture.

The capacitance of the capacitor $C_p$ is measured by using the first sensor element 3 shown in FIG. 1. In order to compensate for secondary influences such as contamination of the mixture, for example, during measurement, a conductance $R_p$ of the measuring configuration, which represents the resistance of the dielectric and thus the losses of the capacitor $C_p$, is measured using the second sensor element 4, and the measurement of the capacitance of the capacitor $C_p$ is thus corrected computationally or by means of circuitry. If the measuring configuration has only one sensor element, the capacitance of the capacitor $C_p$ and the conductance $R_p$ are measured sequentially thereby.

The sensor elements 3 and 4 are produced from a nickel/iron alloy and have a thin wall thickness. This material has the advantage of permitting effective contacting to the measuring circuit 1 by means of a wire 7. One wire 7 is welded to each respective sensor element 3 and 4 and is soldered in the measuring circuit 1. Consequently, the sensor elements 3 or 4 represent an electrical connection between the capacitor $C_p$ and the measuring circuit 1. Due to the thin wall of the sensor element 3, there is a good heat transfer to the temperature sensor 8. The temperature dependence of the relative dielectric constant $\epsilon_r$ is therefore taken into account in determining the alcohol content illustrated in FIG. 6.

The two sensor elements 3 and 4 are identically constructed. They are disposed at a largely identical distance from the casing 2. They are insulated electrically and thermally from the casing 2 by a glass encapsulation.

The casing 2 is produced from aluminum by pressure casting. Since the mixture can be very aggressive chemically, the casing 2 is coated with copper and nickel. As a result, the casing 2 together with the baseplate 9 also offers an effective screen against electromagnetic fields.

In the measuring instrument according to FIG. 1, the capacitance of the capacitor $C_p$ and the conductance $R_p$ of the measuring configuration are determined by using the two sensor elements 3 and 4. Depending on the application, it is also possible to determine the alcohol content of the mixture by means of a measuring instrument having a measuring configuration which has only one sensor element. In this case, the capacitance of the capacitor $C_p$ and the conductance $R_p$ are measured sequentially in time. The measuring circuit 1 can be connected to each of the two measuring configurations.

Figure 2:
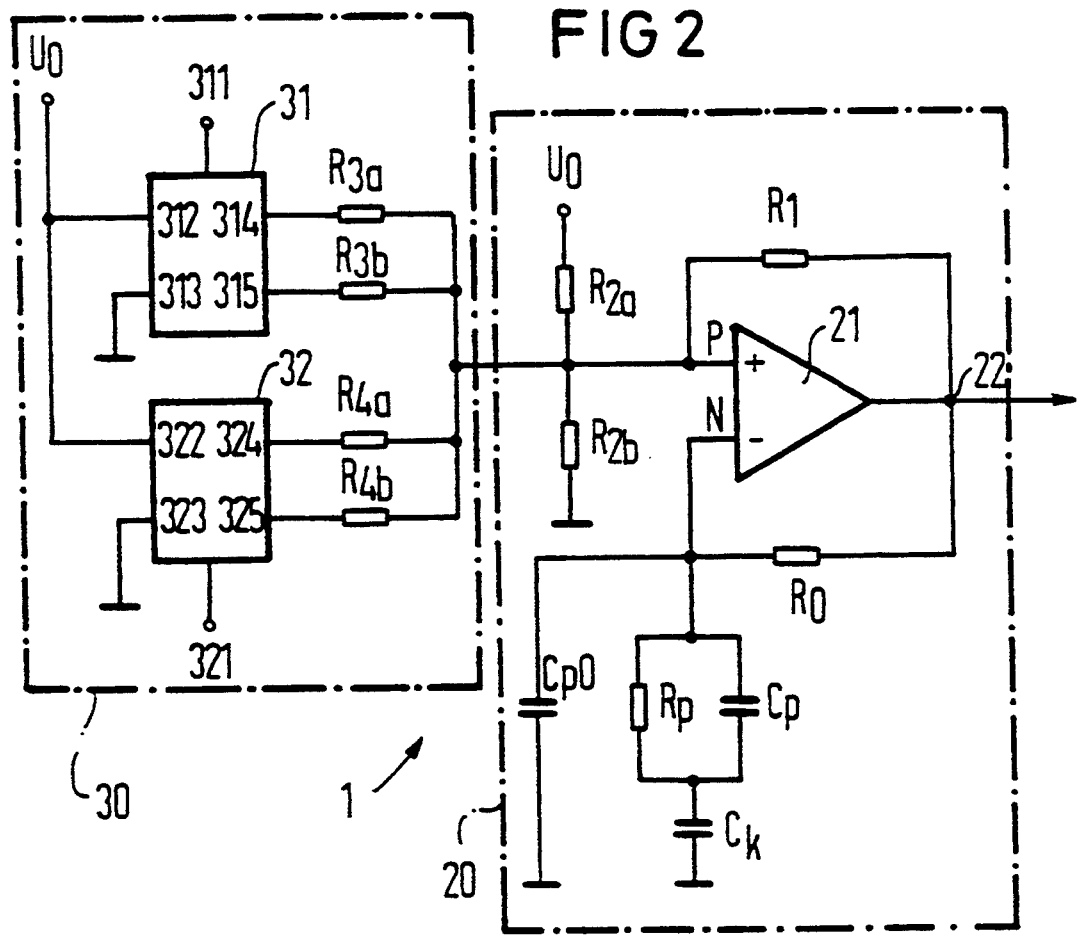
FIG. 2 is a schematic and block diagram of a measuring circuit of the measuring instrument according to FIG. 1.

The measuring circuit 1 shown in FIG. 2 includes an oscillator 20 and a control circuit 30 which is connected upstream of the oscillator. The oscillator 20 contains a comparator 21 and an RC network which is connected to the comparator. An output 22 of the comparator 21 is fed back through a resistor $R_1$ to a positive input (P input) of the comparator, and through a resistor $R_0$ to a negative input (N input).

The output 22 also leads to a microcontroller which is not shown in FIG. 2. The evaluation of the measurement results is performed there, that is to say the determination of the capacitance of the capacitor $C_p$ and of the relative dielectric constant $\epsilon_r$, and thus of the alcohol content of the mixture.

The measuring configuration, which is represented by the capacitor $C_p$ and the conductance $R_p$, is a part of the RC network. The measuring configuration is connected to the N input of the comparator 21. The measuring configuration is connected to ground through a coupling capacitor $C_k$ connected in series. A further capacitor $C_pO$ is connected to ground in parallel with the measuring configuration.

The P input of the comparator 21 is connected to the center tap of a voltage divider which in turn is connected to the supply voltage $U_0$ through a resistor $R_{2a}$ and to ground through a resistor $R_{2b}$.

The control circuit 30 includes resistors $R_{3a}$, $R_{3b}$, $R_{4a}$ and $R_{4b}$ and two gates 31 and 32, which have tristate outputs 314, 315, 324 and 325. The gates 31 and 32 are selected separately through respective enable inputs 311 and 321 by the microcontroller. If the enable inputs 311 and 321 are at a logic level "high", the logic levels at inputs 312, 313, 322 and 323 are respectively switched through to the outputs 314, 315, 324 and 325 (the gates are "enabled"). If the enable inputs 311 or 321 are at a "low" logic level, the respective gates 31 and 32 are closed ("disabled") and the output resistors of the outputs 314 and 315 or 324 and 325, respectively, of the gates assume a high-resistance state.

Depending on the selection of the two enable inputs 311 and 321, the control circuit 30 assumes four different states, that is to say four different control voltages are generated. In the first state, the gate 31 is disabled and the gate 32 enabled, both gates are disabled in the second state, the gate 32 is disabled and the gate 31 is enabled in the third state, and both gates are enabled in the fourth state.

Figure 3A:
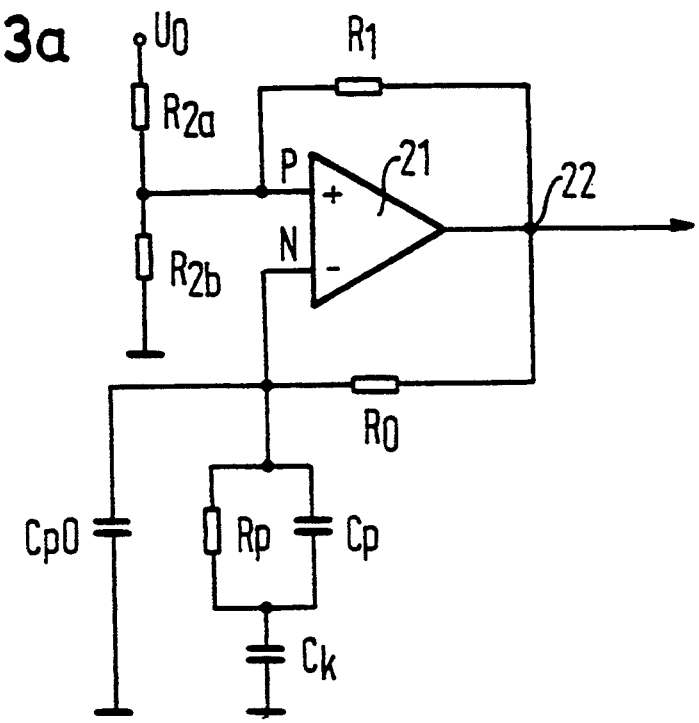
FIGS. 3a and 3b are two equivalent schematic circuit diagrams of the measuring circuit according to FIG. 2 for two different states of a control circuit.

The outputs 314, 315, 324 and 325 of the gates 31 and 32 are connected to the P input through the resistors $R_{3a}$, $R_{3b}$, $R_{4a}$ and $R_{4b}$, respectively. If, for example, the gates 31 and 32 of FIG. 2 are disabled, the effect of the high-resistance output resistors is like a no-load operation at this location. FIG. 3a results as the equivalent circuit diagram. In this state, the resistors $R_{3a}$, $R_{3b}$, $R_{4a}$ and $R_{4b}$ have no influence on the measuring circuit 1. Only the resistors $R_{2a}$ and $R_{2b}$ determine the input voltage $U_+$ at the P input of the comparator 21.

If, for example, the gates 31 and 32 of FIG. 2 are enabled, the input voltages are switched through to the outputs of the gates, which is to say that the "high" level is directly at the outputs 314 and 324, and the "low" level is at the outputs 315 and 325.

Figure 3B:
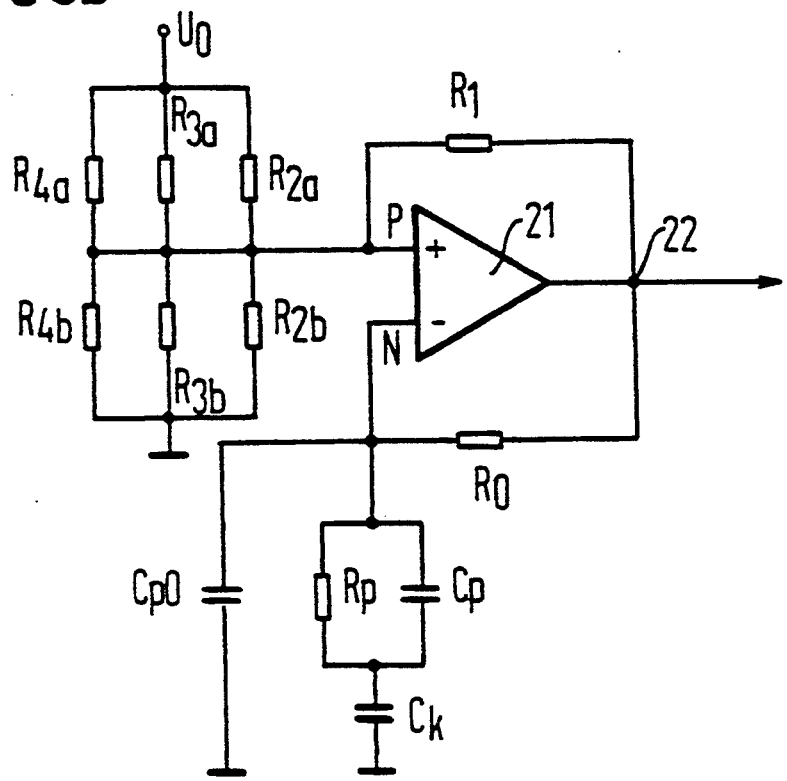

The equivalent circuit diagram for this state is represented in FIG. 3b. An internal resistance of the gates 31 or 32, which is respectively connected in series with the resistors $R_{3a}$, $R_{3b}$, $R_{4a}$ and $R_{4b}$, can be neglected, since the resistors $R_{3a}$, $R_{3b}$, $R_{4a}$ and $R_{4b}$ are dimensioned much larger than the internal resistance. Consequently, the outputs 314 and 324 are directly connected to the supply voltage $U_O$, and the outputs 315 and 325 are connected to ground. In this state, the input voltage $U_+$ (control voltage) at the P input of the comparator 21 is determined by three parallel-connected voltage dividers having the resistors $R_{2a}$, $R_{2b}$, $R_{3a}$, $R_{3b}$, $R_{4a}$ and $R_{4b}$. The resistors $R_{2a}$, $R_{2b}$, $R_{3a}$, $R_{3b}$, $R_{4a}$ and $R_{4b}$ are respectively equal in pairs, that is $R_{2a}=R_{2b}$, $R_{3a}=R_{3b}$, etc. It is thus ensured that in each state the same working point is present at the P input of the comparator 21, which is to say that at the P input a mean voltage potential is present symmetrically in each state between the supply voltage $U_0$ and ground. In this exemplary embodiment, the resistors $R_{2a}=R_{2b}=R_{3a}=R_{3b}=R_{4a}=R_{4b}$ are approximately 200 Ω. As a result, the working point of the comparator 21 is at approximately +2.5 V given a supply voltage $U_0=+5$ V.

The resistor $R_1$ is approximately 200 Ω, and the resistor $R_0$ is approximately 680 Ω. The gates 31 and 32 are realized using a Type 74 ACT 245 busdriver from National Semiconductor. The CF72220 module from Texas Instruments is used as the comparator 21. The measuring circuit 1 can also be realized completely as an application-specific integrated circuit (ASIC).

The effect of the charging and discharging of the capacitors $C_p$ and $C_{p0}$ is that the output signal of the comparator 21 reaches its two inputs, that is the P input and the N input with a delay through feedback. As a result, the oscillator 20 oscillates at an oscillator frequency f or with a period T, and its transfer characteristic has a hysteresis curve.

In order to decouple the measuring configuration in terms of DC voltage, and to connect the working point symetrically to the P input, the coupling capacitor $C_k$ in series with the parallel circuit of the capacitor $C_p$ and the conductance $R_p$ is connected to ground. The capacitance of the capacitor $C_p$ is approximately between 6 pF and 120 pF. It depends on the alcohol content of the mixture. The loss resistance, which is designated herein as the conductance $R_p$, is greater than approximately 500 Ω. The capacitance of the coupling capacitor $C_k$ is approximately 100 nF. Since the capacitance of the coupling capacitor $C_k$ is very much larger than the capacitance of the capacitor $C_p$, and the two capacitors $C_k$ and $C_p$ are connected in series, the coupling capacitor $C_k$ can be neglected in determining the capacitance of the capacitor $C_p$.

The control voltage at the P input of the comparator 21 oscillates symmetrically about the working point and depends on the different states of the control circuit 30. The following relationship holds:

$$U_{+n} = U_a / \left( 1 + R_1 * \sum_{i=2}^{n} (1/R_{ia} + 1/R_{ib}) \right) := a_n + U_a \qquad (1)$$

where $U_{+n}$ is the control voltage at the P input, and $R_{ia}$ and $R_{ib}$ signify $R_{2a}$ and $R_{2b}$, respectively, for i=2, with the corresponding result holding for i=3 and 4.

In the case of the states n=2, 3 and 4, equation (1) describes the control voltage at the P input when the control circuit 30 assumes the second, the third and the fourth states, respectively. $a_n$ is a constant which, given the above-mentioned dimensioning of the resistors, amounts to $a_2=\frac{1}{3}$ in the second state, $a_3=1/5$ in the third state, and $a_4=1/7$ in the fourth state.

The input voltage U— at the N input is described by a differential equation:

$$U_a = U_-*(1+R_o/R_p) + dU_-/dt*R_o*C_p \qquad (2)$$

with the expression $dU_-/dt$ signifying the time derivative of the input voltage $U_-$.

The working point of the measuring circuit 1 is set by the voltage divider at the P input, and assumes that symmetricaloutput thereto the output voltage $u_a$ can adopt only two values having an output voltage range of $(u)_a$. It holds for the output voltage $U_a$ at the working point that:

$$U_a = \begin{cases} u_a/2 & \text{for } m^*T < t \leq (m + 1/2)^*T \\ -u_a/2 & \text{for } (m + 1/2)^*T < t \leq (m + 1)^*T \end{cases} \quad (3)$$

where $m = 1, 2, \ldots$ (whole number; number of periods), $T$ = period, and $t$ = time.

Using equation (1), the control voltage $U_+$ at the P input is yielded for each state of the control circuit 30 using a period of $T_n$ as:

$$U_{+n} = a_n * \begin{cases} u_a/2 & \text{for } m^*T_n < t \leq (m + 1/2)^*T_n \\ -u_a/2 & \text{for } (m + 1/2)^*T_n < t \leq (m + 1)^*T_n \end{cases} \quad (4)$$

and the input voltage $U_-$ at the N input as $$U_- = \begin{cases} U_a^*R_p/(2^*(R_0 + R_p)) - u_-^*\exp(-t/(R^*C_p)) & \text{for } m^*T < t \leq (m + 1/2)^*T \\ -U_a^*R_p/(2^*(R_0 + R_p)) + u_-^*\exp(-t/(R^*C_p)) & \text{for } (m + 1/2)^*T < t \leq (m + 1)^*T \end{cases} \quad (5)$$

where $R = R_o \| R_p = R_o^*R_p/(R_o + R_p)$ and $u_- =$ input voltage range at the N input.

The input voltage $U_-$ oscillates at the oscillator frequency f and with the period T in a hysteresis curve symmetrically about the working point with the two voltage values specified in equation (5) (switching voltage).

Taking account of a propagation time L of the comparator 21, that is to say the time which a signal requires to pass from an input to the output 22 of the comparator, the boundary conditions for the solution of equation (5), and thus for the input voltage $U_-$, are as follows:

$$U_-(T=T/2-L) = U_+(T=T/2-L) = a_n^*U_a/2 \quad (6)$$

$$U_-(t=0) = -U_-(t=T/2) \quad (7)$$

Equation (6) expresses that the switching voltage has already been reached earlier than the switch-over instant by the propagation time L. Equation (7) takes account of the fact that the input voltage $U_-$ at the instant $t=0$ is not at the switching voltage, but at a voltage which is reached beyond the switching voltage in the propagation time L. If the boundary conditions are taken into account in equation (5), that equation can be solved for the period T. The period $T_n$:

$$T_n = 2^*(L + R^*C_p^*\ln(2/(1 - a_n + (R + R_p)/R_p) *\exp(-L/(R^*C_p)))) \quad (8)$$

is yielded for the states n = 2, 3 and 4.

In each state of the control circuit 30 another oscillator frequency f is yielded, and thus another period $T_n$ as well as another hysteresis curve. There are three unknown parameters in equation (8), specifically the capacitance of the capacitor $C_p$ which is to be measured and the associated conductance $R_p$ as well as the propagation time L. All other parameters are known. In order to determine the three unknowns, three different equations are required within a measuring cycle. This is brought about by using the microcontroller to set the three states of the control circuit 30, and measuring the period $T_n$ in each state. It follows from equation (8) that the output voltage $U_a$ of the comparator 21 does not influence the period $T_n$. Consequently, scatter of the output voltage $U_a$ and of the output resistance of the comparator 21 are insignificant, as are fluctuations in temperature, time and supply voltage $U_0$.

Due to the component tolerances, the propagation time L of a signal from an input of the comparator 21 to its output 22 can vary. Since the propagation time L is taken into account in each measuring cycle, the capacitor $C_P$ and the conductance $R_p$ can be determined largely independently of component tolerances of the comparator 21. Consequently, a cost-effective comparator 21 can be used in the measuring circuit 1 without loss of accuracy.

Small capacitances are measured using this measuring circuit 1. Since the charging and discharging times of such capacitors are very small, the oscillator 20 would oscillate at a high oscillator frequency f. In turn, this would require quick and thus expensive components. Since the oscillator frequency f of the oscillation is limited by the finite propagation time L of the comparator 21, the capacitance of the capacitor $C_p$ can be measured accurately only if the oscillator frequency f of the oscillation is diminished. For this purpose, the known capacitor $C_{p0}$ is connected in parallel with the capacitor $C_p$ to be determined, and thus the capacitance to be measured is enlarged, that is the two capacitances of the capacitors $C_p$ and $C_{p0}$ are added together. The charging and discharging times are lengthened. It is then necessary in equation (8) for the capacitance of the capacitor $C_p$ to be replaced by the capacitance of the capacitor $C_p + C_{po}$.

The capacitance of the capacitor $C_{po}$ is approximately 30 pF in this exemplary embodiment. The capacitance to be determined is therefore yielded approximately between 36 pF and 150 pF. In order to obtain the capacitance of the capacitor $C_p$, capacitance of the capacitor $C_{p0}$ is taken into account computationally, for example in the microcontroller, when evaluating the measurement results.

Figure 4:
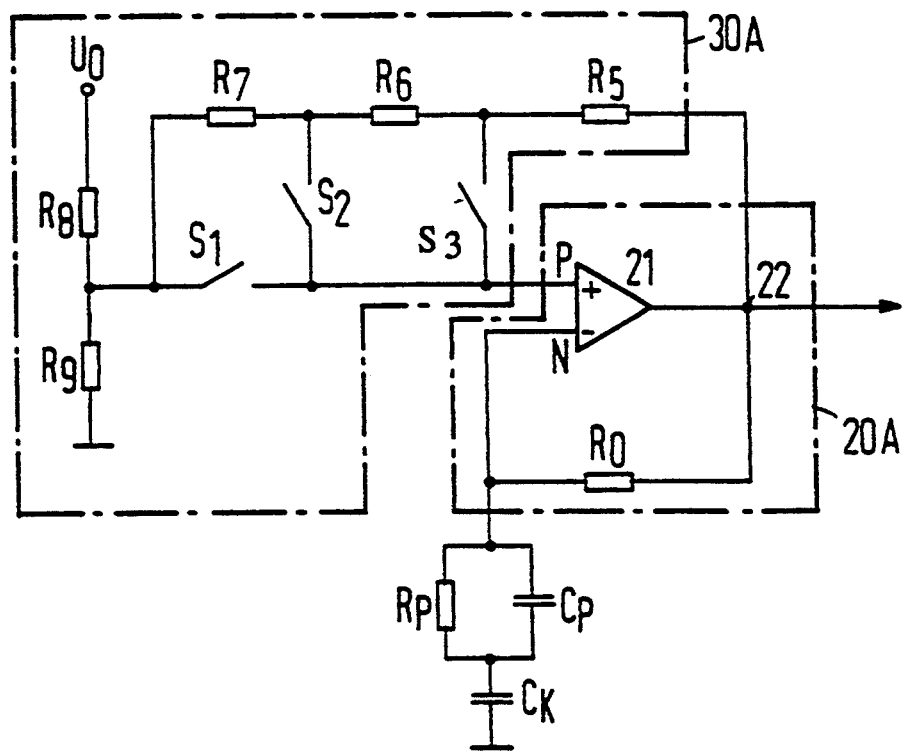
FIG. 4 is a further schematically represented measuring circuit according to the invention, of the measuring instrument of FIG. 1.

A further exemplary embodiment of the invention is represented in FIG. 4. The parts which have already been described with the aid of FIGS. 1 and 2 have been given the same reference symbols in FIG. 4.

A control circuit 30A having switches S1, S2 and S3 as well as resistance dividers with resistors R5, R6, R7, R8 and R9 is connected to an oscillator 20A through the P input and the output of the comparator 21. The measuring configuration which is represented by the capacitor $C_p$ and the conductance $R_p$ is connected to the N input of the comparator 21. The measuring configuration is connected to ground through the series-connected coupling capacitor $C_k$. The output 22 of the comparator 21 is fed back through the resistor $R_0$ to the N input of the comparator, and through the control circuit 30A to the P input.

The switches S1 to S3 are controlled by the microcontroller, which is not represented in FIG. 4. Depending on the position of the switches S1 to S3, the P input of the oscillator 20A is supplied with another control voltage by means of the division ratio at the resistance dividers. The control voltage determines the hysteresis curve of the oscillator 20A, and thus the oscillator frequency f which is set up. In a manner analogous to equation (8), it is also necessary in this case for the three unknown parameters to be determined, for which purpose the three states are set through the microcontroller by means of the different control voltages, and in each state the period $T_n$, and thus the oscillator frequency, is measured.

Instead of using tristate gates 31 and 32 in the control circuit, in this exemplary embodiment the switches S1 to S3 are realized as semiconductor switches having volume resistances which are much smaller than the input resistance of the comparator 21, and can thus be left out of consideration. Parasitic capacitances of the switches S1 to S3 are minimized to negligible values by integrating the entire measuring circuit 1 as ASIC. Likewise integrated as a circuit on the ASIC (not represented in FIG. 4) are dividers and counters required for measuring the period $T_n$, a logic circuit con-trolled by the microcontroller, a quartz oscillator, a measuring oscillator for measuring the temperature of the mixture and an interface circuit for control and data transfer.

Beyond the above-mentioned technical field, the measuring instrument according to the invention has further areas of application in the sphere of capacitive sensors. The measuring circuit 1 can, for example, be used in a chemical sensor for analyzing liquids which contain two components, in a level gauge, in a displacement sensor, a pressure sensor, a contact detector, or in a quick-response thermometer in the case of a liquid with a known dielectric.

The term "conductance" used in the above description is synonymous with the term "loss resistance".

I claim:

1. A measuring instrument for determining the alcohol content of a mixture, comprising;
   a measuring configuration through which a mixture flows, said measuring configuration including a casing with a wall, part of said wall forming a first electrode, and a sensor element around which the mixture flows, said sensor element forming a second electrode, said first and second electrodes forming a capacitor and the mixture flowing between said first and second electrodes forming a dielectric of said capacitor, said capacitor having a capacitance and the dielectric having a conductance, and wherein an alcohol content of the mixture is to be determined from a dielectric constant of the mixture determined from the capacitance and from the conductance;
   a measuring circuit having an oscillator with a first input connected to said measuring configuration and a second input;
   a control circuit connected to said second input for generating a given number of control voltages and transmitting the control voltages to said second input of said oscillator; and
   means for measuring an oscillator frequency for each of the control voltages.

2. The measuring instrument according to claim 1, including means for determining a corresponding number of parameters of said measuring configuration from the measured oscillator frequencies.

3. The measuring instrument according to claim 1, wherein said measuring circuit is an integrated, customer-specific circuit.

4. The measuring instrument according to claim 3, wherein said control circuit generates three different control voltages within a measuring cycle.

5. The measuring instrument according to claim 1, wherein said oscillator has an output, and the measuring instrument further includes a microcontroller connected to the output of said oscillator for determining the capacitance and the conductance of said measuring configuration from the measured oscillator frequencies.

6. The measuring instrument according to claim 1, wherein said oscillator has a comparator and an RC network connected to said comparator.

7. The measuring instrument according to claim 6, wherein said RC network includes said measuring configuration.

8. The measuring instrument according to claim 1, wherein said control circuit has at least one gate with tristate outputs, and a resistance network connected to said at least one gate.

9. A method for determining the alcohol content of a mixture with a measuring instrument including:
   a measuring configuration through which a mixture flows, the measuring configuration forming a capacitor having a capacitance and the mixture flowing through the capacitor having a conductance and the alcohol content of the mixture is to be determined from the capacitance and the conductance, the measuring configuration including a casing with a wall, part of the wall forming a first electrode, and a sensor element around which the mixture flows, the sensor element forming a second electrode; and a measuring circuit having an oscillator with a first input connected to the measuring configuration and a second input receiving a given number of control voltages, whereby the capacitance of the capacitor is determined from an oscillator frequency, and means for measuring the oscillator frequency for each of the control voltages;
   the method which comprises:
   generating the control voltages in a control circuit for supplying the control voltages to the oscillator, and
   generating a plurality of the oscillator frequencies by varying the control voltage for determining a plurality of parameters of the measuring configuration from the oscillator frequencies.

10. The method according to claim 9, which comprises determining the capacitance and the conductance of the measuring configuration from the measured oscillator frequencies, and determining a relative dielectric constant of the mixture from the capacitance and from the conductance.

* * * * *